United States Patent
Whiting et al.

(10) Patent No.: US 9,396,972 B2
(45) Date of Patent: Jul. 19, 2016

(54) MICRO-ASSEMBLY WITH PLANARIZED EMBEDDED MICROELECTRONIC DIES

(71) Applicant: Palo Alto Research Center Incorporated, Palo Alto, CA (US)

(72) Inventors: Gregory L. Whiting, Menlo Park, CA (US); Rene A. Lujan, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 11 days.

(21) Appl. No.: 14/178,217

(22) Filed: Feb. 11, 2014

(65) Prior Publication Data

US 2015/0228508 A1    Aug. 13, 2015

(51) Int. Cl.
| | |
|---|---|
| *H01L 21/44* | (2006.01) |
| *H01L 21/56* | (2006.01) |
| *H01L 21/50* | (2006.01) |
| *H01L 23/00* | (2006.01) |
| *H01L 23/31* | (2006.01) |

(52) U.S. Cl.
CPC .............. *H01L 21/565* (2013.01); *H01L 21/50* (2013.01); *H01L 21/56* (2013.01); *H01L 21/561* (2013.01); *H01L 21/568* (2013.01); *H01L 24/24* (2013.01); *H01L 24/82* (2013.01); *H01L 24/96* (2013.01); *H01L 23/3107* (2013.01); *H01L 2224/24137* (2013.01)

(58) Field of Classification Search
CPC ....... H01L 21/50; H01L 21/56; H01L 21/561; H01L 21/568; H01L 24/96

USPC .......................... 438/107, 110, 113, 125–127
See application file for complete search history.

(56) References Cited

U.S. PATENT DOCUMENTS

| | | | |
|---|---|---|---|
| 8,544,167 B2 * | 10/2013 | Morita ................ | H01L 21/6835 29/831 |
| 2004/0160752 A1 * | 8/2004 | Yamashita ........ | H01L 23/49894 361/766 |
| 2010/0192365 A1 | 8/2010 | Chow et al. | |
| 2013/0200534 A1 * | 8/2013 | Shiobara ................. | H01L 21/78 257/787 |

* cited by examiner

*Primary Examiner* — Matthew E Warren
(74) *Attorney, Agent, or Firm* — Bever, Hoffman and Harms, LLP (57) ABSTRACT

An IC assembly includes multiple microelectronic dies embedded in a substrate material using capillary forces such that the contact surface of each microelectronic die is coplanar with a planar upper surface of the substrate material. The substrate material is deposited as a layer of uncured polymer in a paste (or other solid form) on a base chip, and then the microelectronic dies are mounted on the layer surface in a predefined pattern. The uncured polymer is then heated until becomes a flowable liquid, causing the microelectronic dies to be pulled into the liquid polymer by capillary forces until the contact surface of each microelectronic die is coplanar with the upper liquid polymer surface. The liquid polymer is then cured to form the substrate material as a cross-linked robust solid film that fixedly secures the microelectronic dies in the predefined pattern. The microelectronic dies are then interconnected using standard metallization techniques.

15 Claims, 6 Drawing Sheets

MICRO-ASSEMBLY WITH PLANARIZED EMBEDDED MICROELECTRONIC DIES

FIELD OF THE INVENTION

This invention relates to assembly techniques used for fabricating microstructures and microdevices, generally referred to herein as "micro-assemblies."

BACKGROUND OF THE INVENTION

Interconnection of small assembled microelectronic chips onto a substrate is made much more facile if those chips are planarized, thereby avoiding the need for interconnects to span a step edge. Planarization of chips has been extensively studied, and conventional approaches typically require pre-patterning of a recess into which the chip is placed, or the use of very thin chips and coating of resist over the chips followed by etching back or the opening of vias to make contact. A problem with these approaches is that they require substantial processing that greatly increases manufacturing costs and introduces complications that can lead to reduced production yields.

What is needed is a cost-effective and reliable process for generating micro-assemblies in which multiple micro-objects (e.g., microelectronic chips) are secured to a common substrate such that surfaces of all of the micro-objects are coplanar with the substrate surface.

SUMMARY OF THE INVENTION

The present invention is directed to microelectronic chip assemblies ("micro-assemblies") including previously fabricated "micro-objects" (e.g., microelectronic integrated circuit (IC) chips) that are integrally embedded in solid polymer. For example, each micro-assembly is produced such that the micro-objects are fixedly secured to an integral (single molded piece) substrate formed entirely by a cured polymer material (e.g., SU8). The integral substrate is melted and then cured such that the cured polymer material contacts the entire bottom and peripheral side surfaces of each micro-object "chip", with the uppermost (contact) surface of each micro-object "chip" being coplanar with the upper surface of the integral substrate such that contact structures of each micro-object are exposed. This arrangement facilitates the use of conventional systems and techniques (e.g., photolithography or ink-jet printing) to form interconnect structures that facilitate the transmission of electrical signals between the various micro-objects.

In accordance with an embodiment, the present invention is directed to a method for generating micro-assemblies in which the micro-objects (chips) are integrally embedded in the polymer substrate without requiring any external applied force, post-placement alignment steps, subsequent removal of material, or the use of very thin chips (as required using some conventional techniques). The method generally involves mounting multiple micro-objects (chips) in a predetermined pattern on a base wafer having a layer of uncured polymer material. The uncured polymer layer has a thickness that is greater than the height (thickness) of the chips, and the polymer material (e.g., SU8 resist) is characterized in that it is able to form a thick uniform coating layer on the base wafer in its uncured state, becomes a flowable liquid (while still uncured) when heated to a relatively low melting point temperature, and is subsequently cured using a higher curing temperature (and/or ultraviolet (UV) light) to form a cross-linked rigid film-like substrate. The uncured polymer layer is then heated to its melting point temperature such that the polymer material melts (liquefies) with the micro-objects disposed thereon, thereby causing the micro-objects to be pulled (i.e., "sink-in-place" straight downward) into the liquid uncured polymer without any applied external force (i.e., other than gravity). According to an aspect of the present invention, under these conditions, capillary (surface) forces cause the micro-objects to "sink" only until the upper surface of each micro-object is planarized to (i.e., made co-planar with) the liquid surface. The polymer material is then fully cured (e.g., through exposure to UV light and/or heat), thereby cross-linking the polymer to form an integral (single piece), film-like solid polymer substrate in which the micro-objects are rigidly integrally embedded and secured. Because the micro-objects "sink-in-place" into the liquid polymer, the original spacing (arrangement pattern) of the micro-objects is maintained during the embedding process, thereby avoiding the need for additional alignment steps. Because the upper micro-object surfaces and the upper substrate surface are coplanar (i.e., because the novel fabrication process avoids the generation of step-like features between the substrate surface and the micro-objects), conventional (i.e., straight or flat) interconnect structures are then formed on or over the upper substrate surface using conventional techniques to provide electric signal paths between the various micro-objects. Because the planarizing process is due to capillary (surface) forces, the micro-objects do not embed (sink) farther than their upper surfaces, so no polymer is disposed on the upper surfaces of the micro-objects after curing, thereby preventing the need for etching back or opening vias prior to formation of the interconnect structures.

According to an embodiment of the present invention, the polymer layer is formed by depositing uncured SU8 resist on a thin base (e.g., glass) wafer. SU8 has a number of beneficial properties including the ability to coat thick films, the ability to melt and become a flowable liquid when heated, and the ability to be subsequently cured to a cross-linked robust film. Once the micro-elements are embedded and the SU8 is cured, the entire resulting structure (including the base wafer) is optionally diced into individual micro-assembly devices (i.e., each micro-assembly device includes a solid polymer substrate disposed on a base wafer "chip"). In an alternative embodiment, uncured SU8 resist is deposited directly on a support plate (frame), and after the micro-elements are embedded and the SU8 is cured, the solid polymer substrate is separated from the support plate (i.e., each micro-assembly device includes only the solid polymer substrate, micro-objects and interconnects).

According to an exemplary embodiment, the micro-objects are mounted on the polymer layer using a silicone roller. In particular, the micro-objects are disposed in the required final pattern arrangement on a "pick-up" (first) surface, which then passes under the roller. The silicone roller is constructed to picks up the micro-objects such that they adhere to the roller in the predetermined pattern, and then releases the micro-objects as it passes over the solid uncured polymer layer. With this approach, the micro-objects are transferred without requiring alignment.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to improved microstructures. The following description is presented to enable one of ordinary skill in the art to make and use the invention as provided in the context of a particular application and its requirements. As used herein, directional terms such as "upper", "lower" and "bottom" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
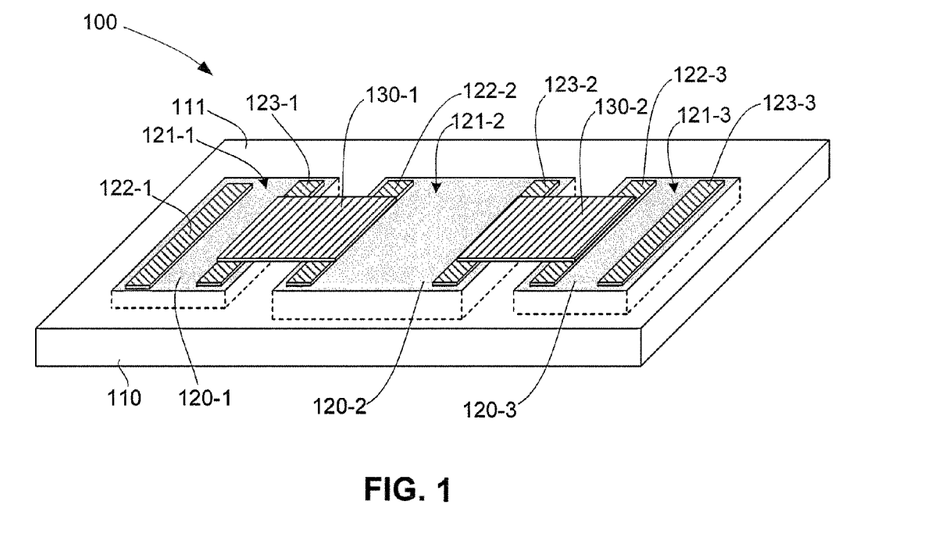
FIG. 1 is a perspective view showing a micro-assembly according to a simplified embodiment of the present invention.

FIG. 1 shows a simplified micro-assembly 100 according to an exemplary embodiment of the present invention. Micro-assembly 100 generally includes a single-piece integral solid polymer substrate 110, micro-objects 120-1, 120-2 and 120-3, and electrically conductive structures 130-1 and 130-2 that are disposed over an upper surface 111 of solid polymer substrate 110.

Figure 2:
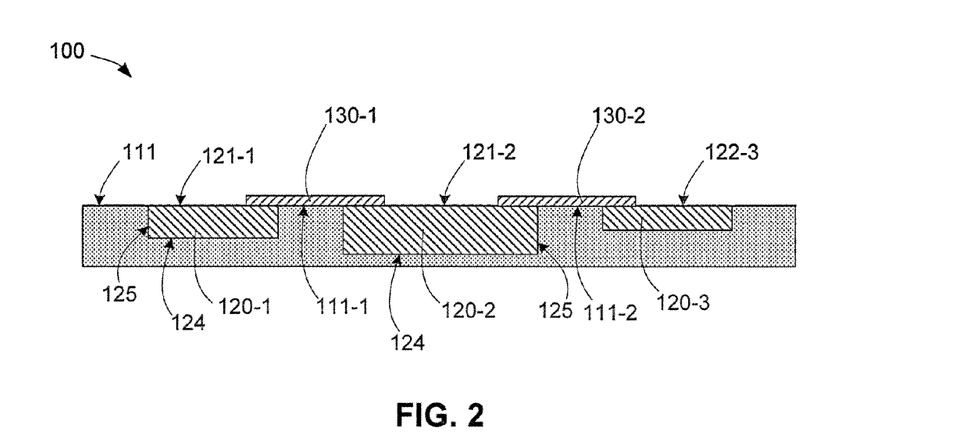
FIG. 2 is a cross-sectional side view showing the micro-assembly of FIG. 1 in additional detail.

According to an embodiment of the present invention, solid polymer substrate 110 is produced entirely from a cured polymer material to form a single-piece integral structure (i.e., similar to that produced by injection molding) with micro-objects 120-1, 120-2 and 120-3 integrally embedded therein. As described in additional detail below, the polymer material is melted (liquefied), the micro-objects 120-1, 120-2 and 120-3 are inserted into the liquid polymer, and then the polymer is solidified/cured, thereby producing a single-piece integral structure that substantially entirely encases micro-objects 120-1, 120-2 and 120-3. That is, as illustrated in FIG. 2, the cured polymer material forming solid polymer substrate 110 extends along the entire length of micro-assembly 100 and contact the entirety of both bottom surfaces 124 and peripheral side surfaces 125 and of each micro-object 120-1, 120-2 and 120-3 without seam or break of any kind. As such, the phrases "single-piece integral solid polymer substrate" and "integrally embedded" are intended to convey that solid polymer substrate 110 is a continuous structure that is secured to and contacts the entirety of the bottom and side surfaces of micro-objects 120-1, 120-2 and 120-3, and therefore distinguishes micro-assembly 100 from assemblies in which micro-objects are connected to a base structure by way of a polymer or adhesive (i.e., where a seam/break exists between each polymer portion and the base substrate).

According to another aspect, upper surface 111 of solid polymer substrate 110 is planar (flat), and micro-objects 120-1, 120-2 and 120-3 are integrally embedded in solid polymer substrate 210 such that contact (upper) surfaces 121-1, 121-2 and 121-3 of micro-objects 120-1, 120-2 and 120-3, respectively, are co-planar with (and exposed through) planar upper surface 111. In particular, upper surface 121-1 of micro-object 120-1 and upper surface 121-2 of micro-object 120-2 are coplanar with surface region 111-1 of upper surface 111 such that upper surfaces 121-1 and 121-2 and surface region 111-1 define a first continuous planar surface portion. Similarly, upper surface 121-3 of micro-object 120-3 and upper surface 121-2 of micro-object 120-2 are coplanar with surface region 111-2 of upper surface 111 such that upper surfaces 121-2 and 121-3 and surface region 111-2 form a second continuous planar surface portion that is also coplanar with the first planar surface portion.

According to yet another aspect of the present invention, planar (flat) electrically conductive structures 130-1 and 130-2 are disposed on corresponding surface regions 111-1 and 111-2 of planar upper surface 111 and provide electrical connections between micro-objects 120-1 to 120-3. Specifically, conductive structure 130-1 includes a first end portion that is electrically connected to a (first) contact structure 123-1 disposed on upper surface 121-1 of micro-object 120-1, a central portion disposed on corresponding surface region 111-1, and a second end portion that is electrically connected to a (second) contact structure 122-2 disposed on upper surface 121-2 of micro-object 120-2, whereby conductive structure 130-1 provides and electrical connection between micro-objects 120-1 and 120-2. Similarly, conductive structure 130-2 includes a first end portion that is electrically connected to a contact structure 123-2 of micro-object 120-2, a central portion disposed on corresponding surface region 111-2, and a second end portion connected to a contact structure 122-3 of micro-object 120-3, whereby conductive structure 130-2 provides and electrical connection between micro-objects 120-2 and 120-3.

An advantage of the novel micro-assembly arrangement depicted in FIGS. 1 and 2 is that, by integrally embedding the micro-objects 120-1 to 120-3 such that their upper surfaces 121-1 to 121-3 are respectively co-planar with planar upper surface 111 of single-piece polymer substrate 110, the present invention facilitates the use of standard methods and techniques to form interconnect structures 130-1 and 130-2 that electrically interconnect embedded micro-objects 120-1 to 120-3 (along with other structures, not shown). That is, because micro-objects 120-1 to 120-3 are embedded such that their contact surfaces/structures do not form an offset (stepped) structure with planar upper surface 111, interconnect structures 130-1 and 130-2 are formed as planar (flat) structures (i.e., without bends that are generated when the interconnect material extends across offset/stepped features), thereby greatly reducing the chance of open-circuit failures caused by breaks in the interconnect structures.

FIGS. 3(A) to 3(F) illustrate a simplified method for fabricating micro-assemblies according to an embodiment of the present invention.

Figure 3A:
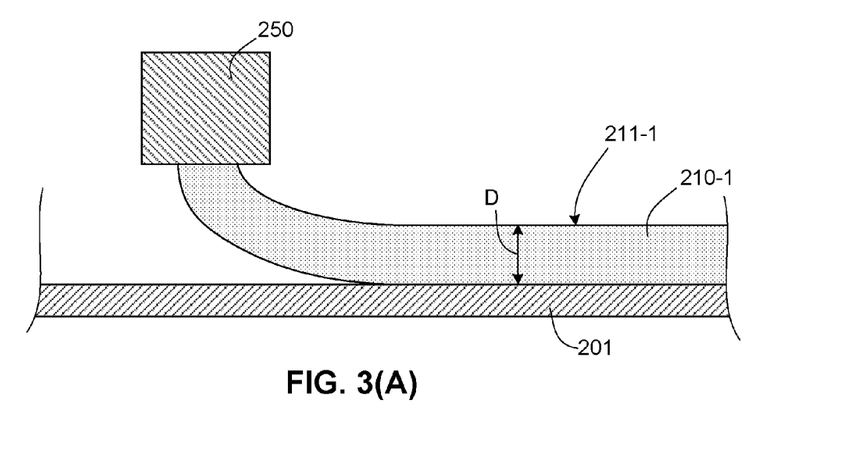
FIGS. 3(A), 3(B), 3(C), 3(D), 3(E), 3(F) and 3(G) are cross-sectional side views showing a method for producing micro-assemblies according to another embodiment of the present invention.
Figure 3B:
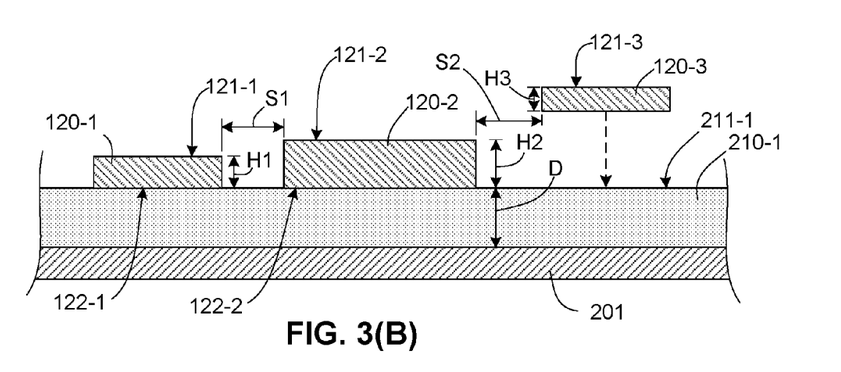

FIG. 3A illustrates an initial process of forming a solid uncured polymer layer 210-1 on a base wafer 201. In one embodiment, base wafer 201 is a thin glass substrate, and uncured polymer layer 210-1 is formed by depositing a layer of SU8 resist by way of a suitable deposition mechanism 250 on the glass substrate (e.g., spin coating). In other embodiments, uncured polymer layer 210-1 comprises another material including other resist or planarizing materials such as cyclotene, or spin-on-glasses, as well as wax-like materials such as paraffin, or crystalbond which may further be formulated to enable eventual cross-linking, in addition readily melted polymers including poly(butadiene) and its copolymers or poly(ethylene oxide) could also be and could be further formulated to allow for eventual cross-linking. According to an aspect of the present invention, uncured polymer layer 210-1 is formed to a depth (thickness) D that is greater than the largest thickness of micro-objects 120-1 to 120-3. That is, as shown in FIG. 3(B), micro-object 120-1 has an associated height (thickness) H1 determined by a nominal distance between lower surface 122-1 and upper surface 121-1, micro-object 120-2 has an associated height (thickness) H2 determined by a nominal distance between lower surface 122-2 and upper surface 121-2, and micro-object 120-3 has associated height H3, with height H2 of micro-object 120-2 being greater than heights H1 and H3 of micro-objects 120-1 and 120-3, respectively. In this case, uncured polymer layer 210-1 is formed with a depth D that is greater than height H2 for reasons that will become clear below.

FIG. 3(B) shows a subsequent process of mounting micro-objects 120-1 to 120-3 onto upper planar layer surface 211-1 of solid uncured polymer layer 210-1 such that micro-objects 120-1 to 120-3 are supported on upper planar layer surface 211-1 (i.e., such that upper surfaces 121-1 to 121-3 face away from upper planar surface 211-1 and are disposed substantially at heights H1 to H3, respectively, above upper layer surface 211-1). According to another aspect, micro-objects 120-1 to 120-3 are mounted in a predetermined spaced-apart pattern corresponding to a desired final micro-object arrangement. In the exemplary embodiment, the predetermined spaced-apart pattern involves positioning micro-object 120-1 relative to micro-object 120-2 with a spacing S1 therebetween, and positioning micro-object 120-3 relative to micro-object 120-2 with a spacing S3 therebetween. In an exemplary embodiment, micro-objects 120-1 to 120-3 have nominal heights (thicknesses) in the range of 5 and 100 μm, and widths in the range of 50 to 500 μm.

Figure 3C:
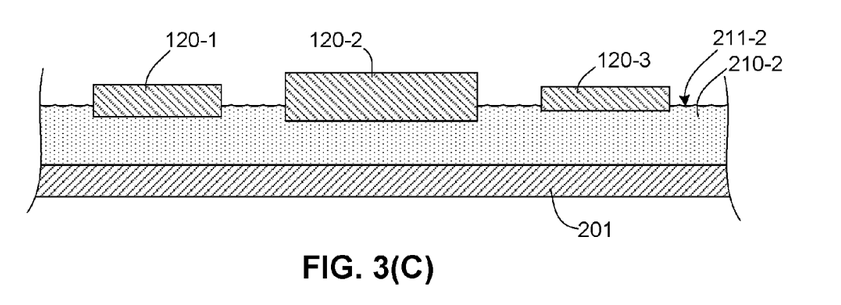
Figure 3D:
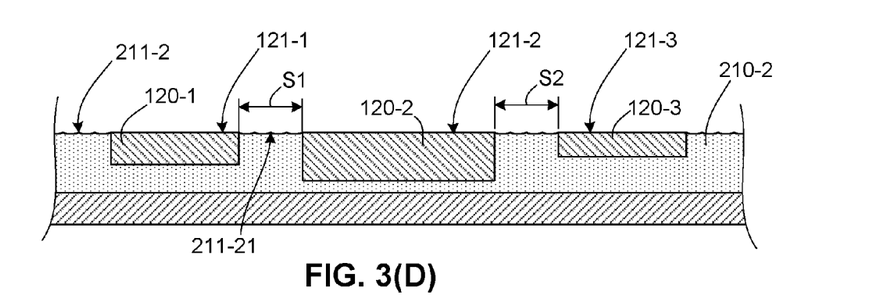

FIGS. 3(C) and 3(D) show the subsequent process involving heating uncured polymer layer 210 to its melting point temperature such that the uncured polymer material melts and forms a liquid uncured polymer pool 210-2, and such that micro-objects 120-1 to 120-3 are pulled (sink) through an upper (now liquid) surface 211-2 into liquid uncured polymer pool 210-2. Referring to FIG. 3(C), in the exemplary embodiment using SU8, the uncured SU8 resist is heated to a temperature in the range of 50° C. and 120° C. to cause the required melting of the SU8 resist material. As the SU8 liquefies, its ability to support micro-objects 120-1 to 120-3 is reduced, and micro-objects 120-1 to 120-3 begin to sink downward into liquid uncured polymer pool 210-2. As indicated in FIG. 3(D), according to an aspect of the present invention, the decent of micro-objects 120-1 to 120-3 into liquid uncured polymer pool 210-2 is limited by capillary forces such that upper surfaces 121-1, 121-2 and 121-3 of micro-objects 120-1, 120-2 and 120-3, respectively, are made co-planar with an upper liquid surface 211-2 (e.g., such that upper surfaces 121-1 and 121-2 of micro-objects 120-1 and 120-2 are made co-planar with an upper surface portion 211-21 of liquid uncured polymer pool 210-2 that extends between micro-objects 120-1 and 120-2). As this process is driven by surface tension, in order for the micro-objects to descend into the resist, it is essential that the resist is able to wet the edges of the chip, thereby pulling the micro-object down until it reaches the top surface. This can be illustrated by controlling the edge profile of the micro-object. If the edge profile of the micro-object is such that it forms a >90° angle with respect to the surface, it will typically rest on the surface and not be pulled into the resist (or will necessitate the use of an external force to force it into the resist). On the other hand if the angle is <90° the resist will wet the micro-object and draw it into the resist until it reaches the top surface, thereby planarizing it. As such, control over the edge profile and surface-energy of the micro-object is useful when applying this method of planarization. Note that, as micro-objects 120-1 to 120-3 are pulled into liquid uncured polymer pool 210-2, they are pulled directly downward primarily by surface tension. The micro-object descent into the resist can be further helped out by applying an external force to help push the chips down (although this is not necessary, surface tension alone should be sufficient, but may not be in all cases) such that they maintain their initial spacing (e.g., micro-objects 120-1 and 120-2 remain separated by predetermined spacing S1, and micro-objects 120-2 and 120-3 remain separated by predetermined spacing S2), thereby obviating the need for additional alignment of micro-objects 120-1 to 120-3 after their initial placement on the polymer (i.e., as described above with reference to FIG. 3(B)).

Figure 3E:
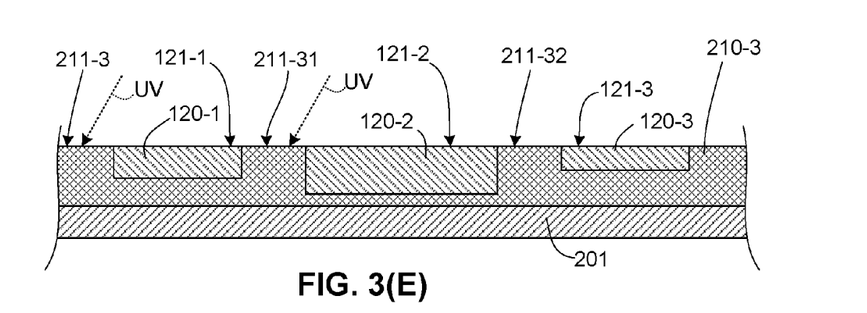

FIG. 3(E) shows the subsequent process of curing the polymer material to form a solid polymer substrate 210-3 having an upper substrate surface 211-3 that is substantially coplanar with exposed upper surfaces 121-1 to 121-3 of micro-objects 120-1 to 120-3. The curing process is performed while the polymer material is still in a liquid form, and involves at least one of applying ultra-violet (UV) light and increasing the amount of heat applied (i.e., the temperature of) the polymer material, thereby causing cross-linking and solidification, whereby micro-objects 120-1 to 120-3 are integrally embedded in solid polymer substrate 210-3 in a co-planar, spaced-apart arrangement (e.g., such that micro-objects 120-1 and 120-2 are integrally embedded in solid polymer substrate 210-3/110 with their associated upper surfaces 121-1 and 120-2 being co-planar with a region 211-31 of upper substrate surface 211-3 that extends between micro-objects 120-1 and 120-2).

Figure 3F:
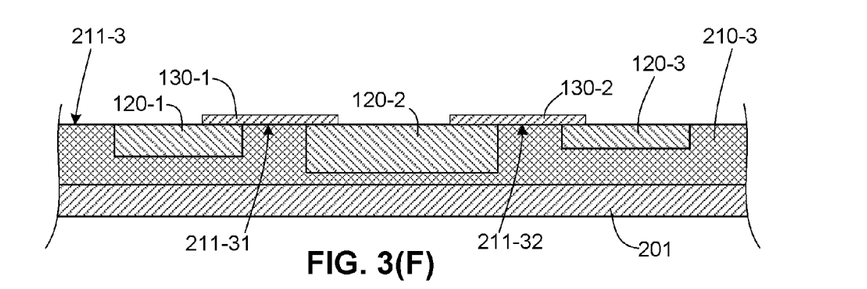

FIG. 3(F) depicts a subsequent process of forming electrically conductive structures 130-1 and 130-2 over upper substrate surface 211-3 to electrically interconnect micro-objects 120-1 to 120-3. For example, electrically conductive structure 130-1 is formed on upper surface region 211-31 and is electrically connected at a first end portion to a first contact structure (e.g., contact structure 123-1, shown in FIG. 1) disposed on micro-object 120-1, and electrically connected at a second end portion to a second contact structure (e.g., contact structure 122-2, also shown in FIG. 1) disposed on micro-object 120-2, whereby micro-objects are electrically connected by way of conductive structure 130-1. As set forth above, because micro-objects 120-1 to 120-3 are co-planar with upper substrate surface 211-3, the process of forming electrically conductive structures 130-1 and 130-2 is reliably performed using standard equipment and techniques (e.g., using one of photolithography and ink-jet printing).

Figure 3G:
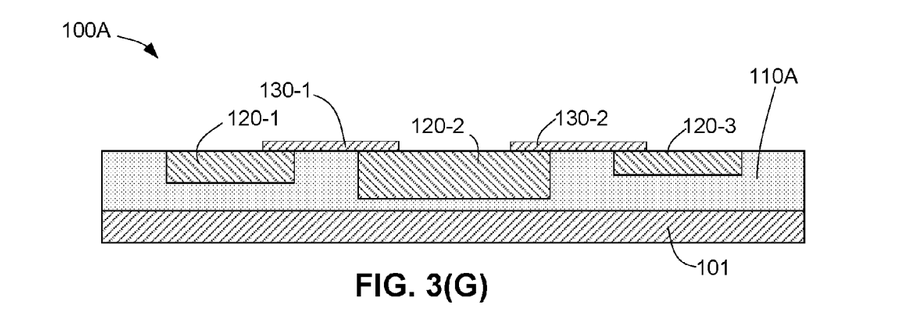

FIG. 3(G) depicts an optional subsequent process of dicing (cutting) the base wafer (and solid polymer material formed thereon) into individual base wafer chips 101 (one shown) after fabrication is completed (e.g., after forming conductive structures 130-1 and 130-2 and any subsequent passivation). The dicing process is performed using known techniques and equipment. As illustrated in FIG. 3(G), each diced base wafer chip 101 supports thereon an associated micro-assembly 100A formed at least in part by micro-objects 120-1 to 120-3 that are integrally embedded in and co-planar with upper substrate surface 111A of a solid polymer substrate section 110A, and conductive structures 130-1 and 130-2. The benefit of forming micro-assembly 100A on base wafer chip 101 is that base wafer chip 101 provides an inexpensive rigid support that reduces the structural strength requirements associated with polymer substrate 110A.

Figure 4A:
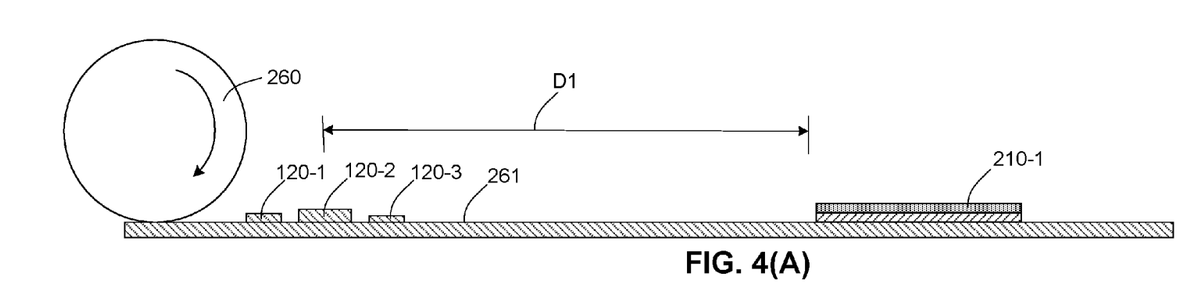
FIGS. 4(A), 4(B) and 4(C) are simplified side views depicting a micro-object transfer process utilized in accordance with an exemplary embodiment of the present invention.
Figure 4B:
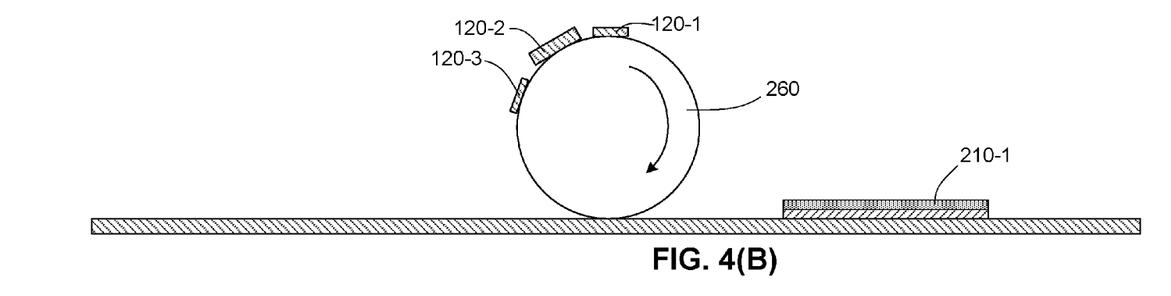
Figure 4C:
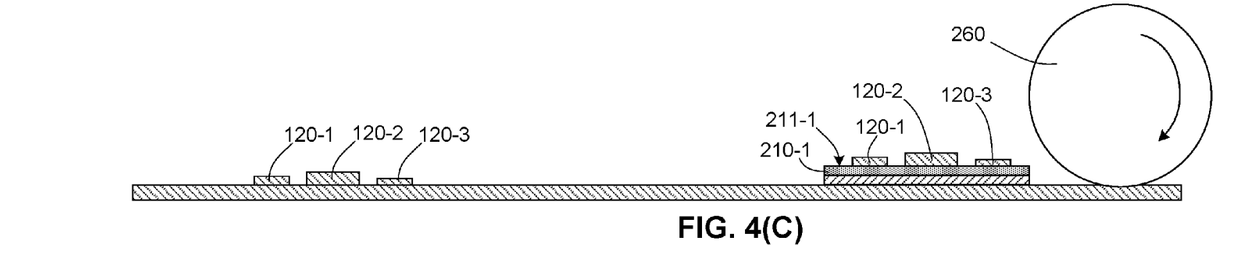

FIGS. 4(A) to 4(C) illustrate a methodology for placing (mounting) micro-objects 120-1 to 120-3 on uncured polymer layer 210-1 using a silicone roller 260 according to an embodiment of the present invention. Referring to FIG. 4(A), micro-objects 120-1 to 120-3 are disposed in the required spaced-apart arrangement (predetermined pattern) on a work surface 261 (e.g., with spacing distances S1 and S2 provided therebetween as described above with reference to FIG. 3(B)) with uncured polymer layer 210-1 disposed a distance D1 away, where distance D1 is determined, for example, by a diameter of roller 260. As indicated in FIGS. 4(A) and 4(B), roller 260 is then passed in a rotating manner over surface 261 and micro-objects 120-1 to 120-3 such that micro-objects 120-1 to 120-3 adhere the silicone surface and are thereby picked up and transported by roller 260. As indicated in FIG. 4(C), roller 260 then passes said roller over upper layer surface 211-1 such that micro-objects 120-1 to 120-3 detach from roller 260 and become disposed on uncured polymer layer 210-1 in the predetermined pattern.

Figure 5A:
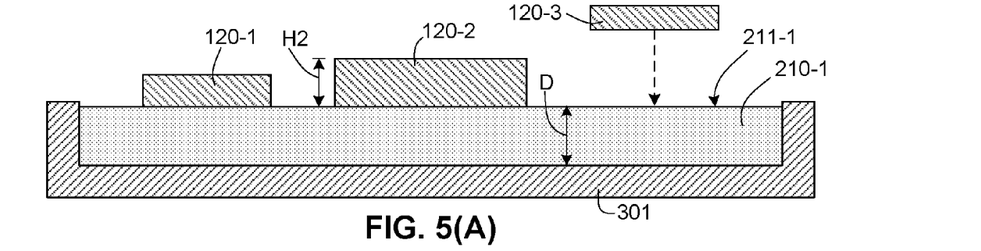
FIGS. 5(A), 5(B), 5(C), 5(D) and 5(E) are cross-sectional side views showing a method for producing micro-assemblies according to another embodiment of the present invention.
Figure 5B:
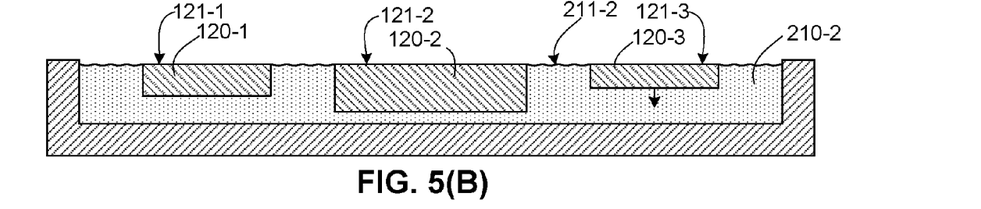
Figure 5C:
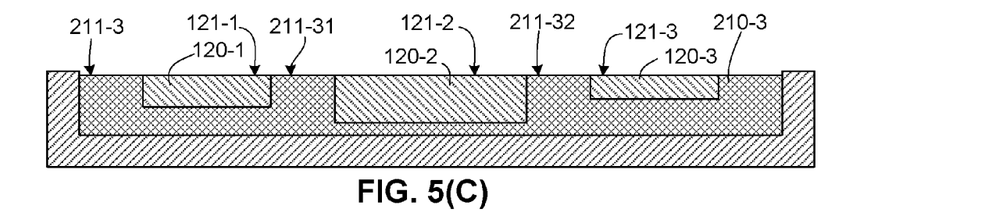
Figure 5D:
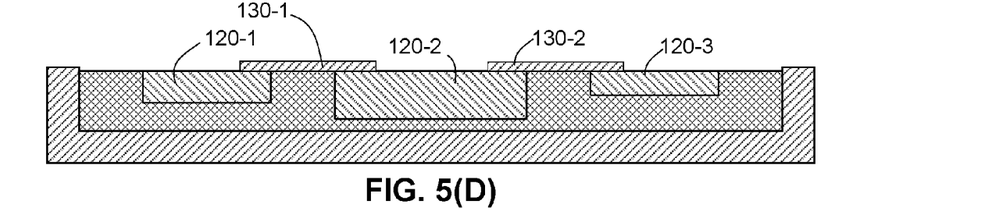
Figure 5E:
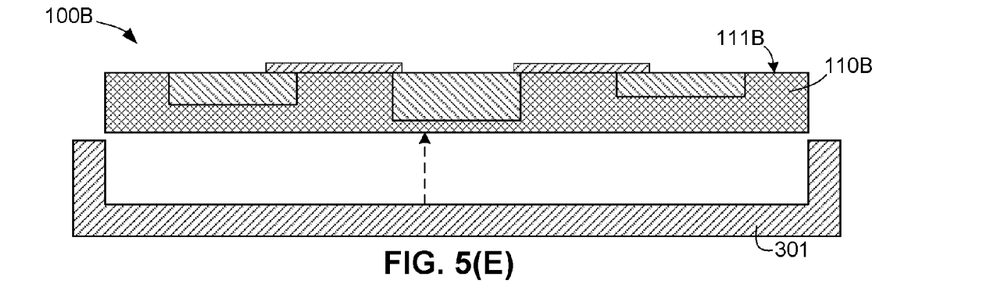

FIGS. 5(A) to 5(E) depict a method for generating a micro-assembly according to another embodiment of the present invention. Referring to FIG. 5(A), similar to the embodiment described above with reference to FIGS. 3(A) to 3(G), the method involves mounting micro-objects 120-1 to 120-3 in a predetermined spaced-apart pattern onto an upper planar layer surface 211-1 of a solid uncured polymer layer 210-1 having a depth D that is thicker than the greatest chip height (e.g., height H2 of micro-object 120-2). However, in this case, solid uncured polymer layer 210-1 is formed on a support plate 301 (i.e., instead of a glass wafer). Referring to FIG. 5(B), the polymer material is then heated to form liquid uncured polymer pool 210-2 such that micro-objects 120-1 to 120-3 are pulled downward by capillary forces until their respective upper surfaces 121-1 to 121-3 are made co-planar with upper pool surface 211-2. Referring to FIG. 5(C), the polymer material is then cured to form a solid polymer substrate 210-3 having an upper substrate surface 211-3 that is substantially coplanar with exposed upper surfaces 121-1 to 121-3 of micro-objects 120-1 to 120-3, whereby micro-objects 120-1/2/3 are integrally embedded in solid polymer substrate 210-3. As shown in FIG. 5(D), electrically conductive structures 130-1 and 130-2 are then formed in the manner described above between micro-objects 120-1 to 120-3. According to another aspect of the present invention, as depicted in FIG. 5(E), the completion of micro-assembly 100B is then accomplished by separating solid polymer substrate 110B from support plate 301. An advantage of this approach is that the final dicing step may be eliminated, but this approach possibly requires the use of a thicker polymer layer, or the subsequent disposition of a rigid plate (not shown) similar to glass chip 101, described above, over upper surface 111B.

Figure 6A:
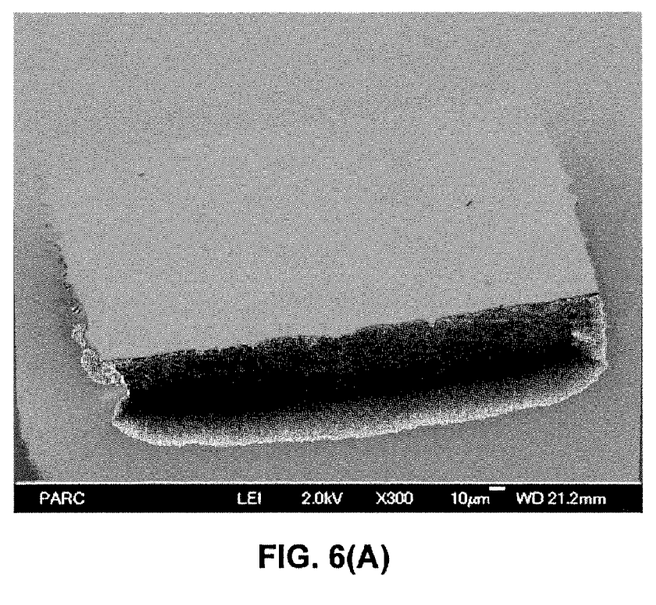
FIGS. 6(A) and 6(B) are scanning electron microscope photographs showing a test arrangement demonstrating the micro-assembly method of the present invention.
Figure 6B:
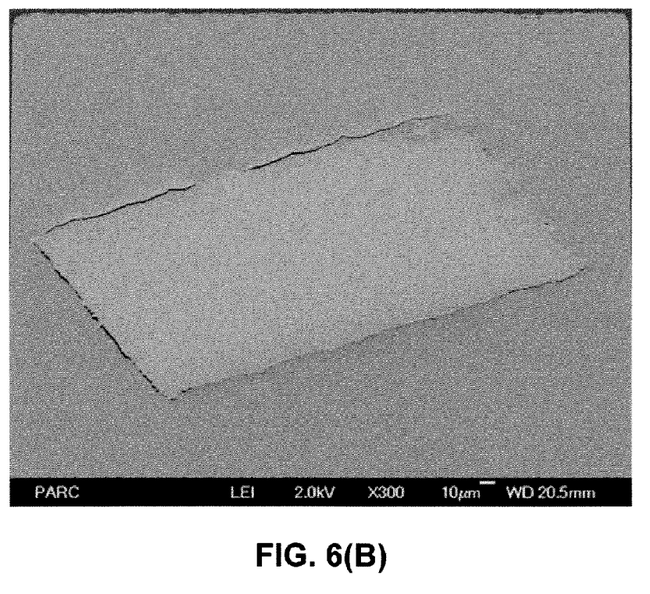

FIGS. 6(A) and 6(B) are SEM images showing a chip mounted on an SU8 layer, and the chip planarized by embedding into the SU8 layer using the process described above.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for generating a micro-assembly comprising:
mounting a plurality of micro-objects in a predetermined spaced-apart pattern onto an upper layer surface of a solid uncured polymer layer consisting essentially of an uncured polymer material, wherein each of the plurality of micro-objects has an associated height and is mounted on the upper layer surface such that exposed upper object surfaces of the plurality of micro-objects face away from the upper layer surface, and wherein said uncured polymer layer has a thickness that is greater than the associated heights of all of said plurality of micro-objects;
heating the uncured polymer layer such that the uncured polymer material forms a liquid uncured polymer pool, and such that said plurality of micro-objects are pulled into the liquid uncured polymer pool such that the exposed upper surface of each said plurality of micro-objects is made co-planar with an upper object surface of the liquid uncured polymer pool by capillary forces;
curing the liquid polymer material to form a solid polymer substrate having an upper substrate surface that is substantially coplanar with said exposed upper object surface of each of the plurality of micro-objects, whereby said plurality of micro-objects are integrally embedded in said solid polymer substrate; and
after said curing, forming a plurality of electrically conductive structures over the upper substrate surface such that at least one associated electrically conductive structure is connected to each of said plurality of micro-objects.

2. The method according to claim 1, further comprising forming said solid uncured polymer layer on a base wafer by depositing a layer of resist, wherein heating said uncured polymer layer comprises heating the SU8 resist to a melting temperature at which the SU8 resist forms said liquid uncured polymer pool.

3. The method according to claim 2, wherein curing the liquid polymer material comprises utilizing at least one of ultraviolet light and heat to cure the resist.

4. The method according to claim 3, wherein forming said plurality of electrically conductive structures comprises utilizing one of photolithography and ink-jet printing to generate said plurality of electrically conductive structures.

5. The method according to claim 1, further comprising:
forming said solid uncured polymer layer on a base wafer before mounting said plurality of micro-objects; and
dicing said base wafer into a plurality of base wafer chips after forming said plurality of electrically conductive structures such that each said base wafer chip comprises an associated micro-assembly formed thereon.

6. A method for generating a micro-assembly comprising:
mounting a plurality of micro-objects in a predetermined pattern onto an upper layer surface of a solid uncured polymer layer consisting essentially of an uncured polymer material, wherein each of the plurality of micro-objects has an associated height and is mounted on the upper layer surface such that upper object surfaces of the plurality of micro-objects face away from the upper layer surface, and wherein said uncured polymer layer has a thickness that is greater than the associated heights of all of said plurality of micro-objects;
heating the uncured polymer layer such that the uncured polymer material forms a liquid uncured polymer pool, and such that said plurality of micro-objects are pulled into the liquid uncured polymer pool such that the upper object surface of each said plurality of micro-objects is made co-planar with an upper surface of the liquid uncured polymer pool by capillary forces;

curing the liquid polymer material to form a solid polymer substrate having an upper substrate surface that is substantially coplanar with an exposed upper object surface of each of the plurality of micro-objects, whereby said plurality of micro-objects are integrally embedded in said solid polymer substrate; and forming a plurality of electrically conductive structures over the upper substrate surface such that at least one associated electrically conductive structure is connected to each of said plurality of micro-objects, wherein mounting said plurality of micro-objects comprises:

disposing said plurality of micro-objects in said predetermined pattern on a first surface;

passing a roller over said first surface said plurality of micro-objects adhere to said roller in said predetermined pattern; and passing said roller over said upper layer surface of said solid uncured polymer layer such that said plurality of micro-objects detach from said roller and become disposed on said solid uncured polymer layer in said predetermined pattern.

7. The method according to claim 1, further comprising:

forming said solid uncured polymer layer on a support plate before mounting said plurality of micro-objects; and separating said solid polymer substrate from said support plate after forming said plurality of electrically conductive structures.

8. A method for generating a micro-assembly comprising:

mounting a first micro-object and a second micro-object in a predetermined pattern onto an upper layer surface of an uncured polymer layer consisting essentially of an uncured polymer material such that the first and second micro-objects are separated by a predetermined spacing;

heating the uncured polymer layer such that the uncured polymer material forms a liquid uncured polymer pool, whereby said first and second micro-objects are pulled without any applied external force into the liquid uncured polymer pool such that said first and second micro-objects remain separated by said predetermined spacing, and such that an associated upper surface of each of said first and second micro-objects is made co-planar with an upper surface portion of the liquid uncured polymer pool that extends between said first and second micro-objects;

curing the liquid polymer material to form a solid polymer substrate having an upper substrate surface that is substantially coplanar with an exposed upper surface of each of the first and second micro-objects, whereby said first and second micro-objects are integrally embedded in said solid polymer substrate with associated exposed upper surfaces of said first and second micro-objects being co-planar with an upper surface region of the solid polymer substrate that extends between said first and second micro-objects;

after said curing, forming an electrically conductive structure on said upper surface region extending between said first and second micro-objects such that said electrically conductive structure is electrically connected at a first end portion to a first contact structure disposed on a first said exposed upper surface of said first micro-object and electrically connected at a second end portion to a second contact structure disposed on a second said exposed upper surface of said second micro-object.

9. The method according to claim 8, wherein the first and second micro-objects have respective first and second heights defined between respective lower surfaces and upper surfaces thereof; and wherein the method further comprises forming said solid uncured polymer layer by depositing sufficient uncured polymer material to form said uncured polymer layer with a thickness that is greater than both of said first and second heights of said first and second micro-objects.

10. The method according to claim 9, wherein forming said solid uncured polymer layer comprises depositing a layer of SU8 resist, and wherein heating said uncured polymer layer comprises heating the SU8 resist to a melting point temperature at which the SU8 resist forms said liquid uncured polymer pool.

11. The method according to claim 10, wherein curing the liquid polymer material comprises utilizing at least one of ultraviolet light and heat to cure the SU8 resist.

12. The method according to claim 11, wherein forming said electrically conductive structure comprises utilizing one of photolithography and ink-jet printing to generate said electrically conductive structure.

13. The method according to claim 8, further comprising:

forming said uncured polymer layer on a base wafer before mounting said first and second micro-objects; and dicing said base wafer into a plurality of base wafer chips after forming said electrically conductive structure such that an associated said base wafer chip comprises an associated micro-assembly including said first and second micro-objects.

14. The method according to claim 8, wherein mounting said first and second of micro-objects comprises:

disposing said first and second micro-objects in said predetermined pattern on a first surface;

passing a roller over said first surface said first and second micro-objects adhere to said roller; and passing said roller over said upper layer surface of said uncured polymer layer such that said first and second micro-objects detach from said roller and become disposed on said uncured polymer layer in said predetermined pattern.

15. The method according to claim 8, further comprising:

forming said solid uncured polymer layer on a support plate before mounting said first and second micro-objects; and separating said solid polymer substrate from said support plate after forming said electrically conductive structure.

* * * * *